(12) United States Patent
Takahashi et al.

(10) Patent No.: US 8,043,659 B2
(45) Date of Patent: Oct. 25, 2011

(54) SUBSTRATE PROCESSING APPARATUS AND SUBSTRATE PROCESSING METHOD

(75) Inventors: Eiji Takahashi, Nirasaki (JP); Norihiko Amikura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 923 days.

(21) Appl. No.: 12/022,533

(22) Filed: Jan. 30, 2008

(65) Prior Publication Data

US 2008/0286491 A1 Nov. 20, 2008

Related U.S. Application Data

(60) Provisional application No. 60/911,652, filed on Apr. 13, 2007.

(30) Foreign Application Priority Data

Jan. 31, 2007 (JP) ................................. 2007-022332

(51) Int. Cl.
C23C 16/00 (2006.01)
H05H 1/24 (2006.01)

(52) U.S. Cl. ........... 427/248.1; 156/345.29; 156/345.31; 156/345.33; 118/715; 216/58; 216/63; 216/74

(58) Field of Classification Search ........................ None
See application file for complete search history.

(56) References Cited

U.S. PATENT DOCUMENTS 5,575,853 A 11/1996 Arami et al.
(Continued)

FOREIGN PATENT DOCUMENTS

| JP | 8-74737 | 3/1996 |
| JP | 9-45623 | 2/1997 |
| JP | 09-195976 | * 7/1997 |
| JP | 11-222678 | 8/1999 |
| JP | 2000-100793 | 4/2000 |
| JP | 2005-39185 | 2/2005 |
| KR | 10-2006-0047528 | 5/2006 |

OTHER PUBLICATIONS

JP09-195976, Takekuma, Jul. 1997, English machine translation.*
JP09-195976, Takekuma, Jul. 1997, US Patent office Official translation of term indicated in machine translation as "inflation valve".*

(Continued)

*Primary Examiner* — Timothy Meeks
*Assistant Examiner* — Joseph Miller, Jr.
(74) *Attorney, Agent, or Firm* — Oblon, Spivak, McClelland, Maier & Neustadt, L.L.P.

(57) ABSTRACT

A substrate processing method capable of controlling the internal pressure of a processing chamber to a high pressure and exhausting gases within the processing chamber at a high rate. The substrate processing method is for use in a substrate processing apparatus having a processing chamber, a supply unit supplying a processing gas into the processing chamber, a first pipe connected to the processing chamber at one end thereof, a turbo molecular pump disposed in the first pipe, a first shutoff valve disposed between the processing chamber and the turbo molecular pump in the first pipe, a second pipe connected to the processing chamber at one end thereof, a pressure control valve disposed in the second pipe, and a dry pump connected to the other end of the first pipe and to the other end of the second pipe. The substrate processing method comprises a pressure control step of controlling the internal pressure of the processing chamber using the pressure control valve after closing the first shutoff valve when performing a treatment on a substrate housed in the processing chamber; a first exhaust step of exhausting gases within the processing chamber through the second pipe using the dry pump by opening the pressure control valve after performing the treatment on the substrate; and a second exhaust step of exhausting gases within the processing chamber through the first pipe using the turbo molecular pump by closing the pressure control valve and opening the first shutoff valve after the first exhaust step.

7 Claims, 3 Drawing Sheets

U.S. PATENT DOCUMENTS

| | | | |
|---|---|---|---|
| 2002/0025682 A1* | 2/2002 | Lin | 438/710 |
| 2002/0028566 A1* | 3/2002 | Yano | 438/484 |
| 2003/0003244 A1* | 1/2003 | Rossman | 427/569 |
| 2003/0203113 A1* | 10/2003 | Cho et al. | 427/255.23 |
| 2004/0262254 A1 | 12/2004 | Ozawa et al. | |
| 2005/0016956 A1* | 1/2005 | Liu et al. | 216/67 |
| 2005/0241670 A1 | 11/2005 | Dong et al. | |
| 2005/0241671 A1 | 11/2005 | Dong et al. | |

OTHER PUBLICATIONS

JP2000-100793, Takayama, Apr. 2000. English machine translation (original JP version and abstract per applicant/IDS).*

Office Action issued Aug. 23, 2010, in China Patent Application No. 200810008939.7 (with English-language Translation).

Chinese Office Action issued Mar. 24, 2011, in Patent Application No. 200810008939.7 (with English-language translation).

* cited by examiner

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method, and more particularly, to a substrate processing apparatus and a substrate processing method for processing substrates in a processing chamber using a hydrogen fluoride gas.

2. Description of the Related Art

In a method for manufacturing semiconductor devices from a silicon wafer (hereinafter simply referred to as the "wafer"), there are successively and cyclically carried out a film formation step, such as chemical vapor deposition (CVD), wherein a conductive film or an insulating film is formed on a surface of the wafer; a lithography step wherein desired patterns of a photoresist layer is formed on the conductive film or the insulating film thus formed; and an etching step wherein the conductive film is shaped into gate electrodes or wiring trenches and contact holes are formed in the insulating film by plasma produced from a processing gas using the photoresist layer as a mask.

In some electronic device manufacturing method, a polysilicon layer formed on a wafer is etched. In this case, a deposit film composed primarily of $SiO_2$ is formed on the side surfaces of trenches (grooves) formed in the wafer.

This deposit film can cause problems, such as a conduction failure, for electronic devices and hence must be removed. As a method for deposit layer removal, there is known a substrate processing method wherein a chemical oxide removal (COR) treatment and a post heat treatment (PHT) are performed on the wafer. The COR treatment causes $SiO_2$ in the deposit layer to chemically react with gas molecules to produce a product. The PHT treatment heats up and sublimates the product on the wafer produced by the chemical reaction in the COR treatment, thereby removing the product from the wafer.

As a substrate processing apparatus for implementing this substrate processing method comprised of COR and PHT treatments, there is known a substrate processing apparatus having a chemical reaction treatment apparatus and a heat treatment apparatus connected thereto (see, for example, Japanese Patent Laid-open No. 2005-39185).

The chemical reaction treatment apparatus has a processing compartment (chamber) for housing wafers, a gas supply system for supplying a hydrogen fluoride gas into the chamber as a processing gas, and an exhaust control system for exhausting gases and the like within the chamber and controlling the internal pressure thereof.

In this chemical reaction treatment apparatus, the above-described chemical reaction treatment is performed on a wafer housed in the chamber by controlling the internal pressure of the chamber to 133 Pa (1 Torr) or higher using the exhaust control system and supplying a hydrogen fluoride gas into the chamber using the gas supply system. At this time, a pressure control valve having a relatively small bore, such as an adaptive pressure control (APC) valve, must be used in order to control the internal pressure of the chamber to 133 Pa (1 Torr) or higher.

In addition, if the hydrogen fluoride gas remains within the chamber when the chamber is communicated with another chamber, the remaining hydrogen fluoride gas may diffuse into the other chamber and cause a problem since the hydrogen fluoride gas is highly reactive. Accordingly, the hydrogen fluoride gas must be exhausted as much as possible from the chamber after the completion of the chemical reaction treatments. Furthermore, the hydrogen fluoride gas is preferably exhausted from the chamber at a high rate from the viewpoint of throughput improvement. Under normal conditions, a turbo molecular pump (TMP) must be used in order to exhaust the hydrogen fluoride gas at a high rate and as much as possible.

However, since the exhaust control system described above uses a pressure control valve having a relatively small bore, the exhaust conductance of the exhaust control system is small. In addition, the upstream pressure of the exhaust control system is as high as 133 Pa (1 Torr) or greater. In general, a TMP is adapted to fulfill its function when applied to an exhaust control system having a large exhaust conductance. Furthermore, the TMP must be used in a low-pressure environment since it may suffer damage when used in a high-pressure environment. Accordingly, it is not possible to apply the TMP to the above-described exhaust control system and, consequently, it is not possible to exhaust gases within the chamber at a high rate.

On the other hand, when a pressure control valve having a relatively large bore is used in order to apply the TMP to the exhaust control system, i.e., in order to increase the exhaust conductance of the exhaust control system, it is in principle not possible for the pressure control valve having a relatively large bore to perform high-pressure control. Consequently, it is not possible to control the internal pressure of the chamber to the aforementioned high pressure of 133 Pa (1 Torr) or greater.

SUMMARY OF THE INVENTION

The present invention provides a substrate processing method and a substrate processing apparatus capable of controlling the internal pressure of a processing chamber to a high pressure and exhausting gases within the processing chamber at a high rate.

In a first aspect of the present invention, there is provided a substrate processing method for use in a substrate processing apparatus having a processing chamber adapted to house substrates, a supply unit adapted to supply a processing gas into the processing chamber, a first pipe connected to the processing chamber at one end thereof, a turbo molecular pump disposed in the first pipe, a first shutoff valve disposed between the processing chamber and the turbo molecular pump in the first pipe, a second pipe connected to the processing chamber at one end thereof and being smaller in sectional area than the first pipe, a pressure control valve disposed in the second pipe and having a predetermined bore, and a dry pump connected to the other end of the first pipe and to the other end of the second pipe, the substrate processing method comprising: a first pressure control step of controlling the internal pressure of the processing chamber using the pressure control valve after closing the first shutoff valve when performing a treatment on a substrate housed in the processing chamber; a first exhaust step of exhausting gases within the processing chamber through the second pipe using the dry pump by opening the pressure control valve after performing the treatment on the substrate; and a second exhaust step of exhausting gases within the processing chamber through the first pipe using the turbo molecular pump by closing the pressure control valve and opening the first shutoff valve after the first exhaust step.

According to the aforementioned first aspect of the present invention, the internal pressure of the processing chamber is controlled by the pressure control valve having the predetermined bore when performing treatments on the substrate housed in the processing chamber. Then, after performing treatments on the substrate, gases within the processing chamber are exhausted by a dry pump through a second pipe by opening the pressure control valve. The gases are further exhausted by a turbo molecular pump through a first pipe by closing the pressure control valve and opening a first shutoff valve. The pressure control valve having the predetermined bore controls the internal pressure of the processing chamber to a high pressure and the turbo molecular pump exhausts the gases within the processing chamber at a high rate. Consequently, it is possible to control the internal pressure of the processing chamber to a high level and exhaust the gases within the processing chamber at a high rate.

The substrate processing apparatus can further include a second shutoff valve disposed between the turbo molecular pump and the dry pump in the first pipe, the supply unit can supply a processing gas into the processing chamber only during a partial period in the first pressure control step, and the second shutoff valve can remain open during the first pressure control step, during the first exhaust step and during the second exhaust step.

With this arrangement, the processing gas is not supplied into the processing chamber over the entire period of time in which the internal pressure of the processing chamber is controlled by the pressure control valve. Consequently, any large volume of processing gas is not exhausted to the downstream side of the pressure control valve when controlling the internal pressure of the processing chamber. As a result, the internal pressure of the first pipe communicated with the second pipe on the downstream side of the pressure control valve, i.e., the exhaust port pressure of the turbo molecular pump, does not rises up to a predetermined high pressure at which the turbo molecular pump may suffer damage. In addition, any large volume of processing gas is not exhausted to the downstream side of the pressure control valve when exhausting the gases within the processing chamber using the dry pump and the turbo molecular pump in the same way as described above. Consequently, there is no need to prevent the exhaust port pressure from rising up to the predetermined high pressure by closing the second shutoff valve. For this reason, the second shutoff valve remains open during a period in which the internal pressure of the processing chamber is controlled by the pressure control valve, during a period in which the gases within the processing chamber are exhausted by the dry pump, and during a period in which the gases within the processing chamber are further exhausted by the turbo molecular pump, thus eliminating the need to stop the turbo molecular pump. When the turbo molecular pump is stopped, it takes time to restart the pump. Accordingly, it is possible to prevent a degradation in the throughput of the substrate processing apparatus.

The substrate processing method can further include a second pressure control step of controlling the internal pressure of the processing chamber using the pressure control valve after closing the first shutoff valve after the second exhaust step.

With this arrangement, it is possible to maintain the internal pressure of the processing chamber at a transfer pressure. As a result, it is possible to prevent any gases from flowing from outside the processing chamber thereinto along with particles when transferring a wafer.

The processing gas can be a hydrogen fluoride gas.

With this arrangement, a hydrogen fluoride gas is supplied from a supply unit into the processing chamber. In general, a deposit film composed of an SiOBr layer, i.e., a pseudo-$SiO_2$ layer is formed on the side surfaces of trenches (grooves) when etching a polysilicon layer of the substrate. The deposit film can be removed by a chemical reaction treatment and a heating treatment making use of a hydrogen fluoride gas, and a hard mask can be removed using the hydrogen fluoride gas. Consequently, in a case where a substrate wherein both a deposit film and a hard mask are formed is housed in the processing chamber, it is possible to remove the deposit film and the hard mask at the same time.

The internal pressure of the processing chamber can be controlled to a pressure as high as 133 Pa (1 Torr) or greater in the first pressure control step.

With this arrangement, it is possible to even more reliably control the internal pressure of the processing chamber to a high level.

The internal pressure of the processing chamber can be controlled to a pressure as high as 2660 Pa (20 Torr) or greater in the first pressure control step.

With this arrangement, it is possible to even more reliably control the internal pressure of the processing chamber to a high level.

The internal pressure of the processing chamber can be controlled to a pressure as high as 4000 Pa (30 Torr) or greater in the first pressure control step.

With this arrangement, the deposit film and the hard mask efficiently and reliably react with the hydrogen fluoride gas in a high-pressure environment of 4000 Pa (30 Torr) or greater. Consequently, it is possible to efficiently and reliably remove the deposit film and the hard mask.

The first shutoff valve can be a pressure control valve which is larger in bore than the pressure control valve.

With this arrangement, it is possible to control the internal pressure of the processing chamber to a low level since the pressure control valve having a large bore is capable of low-pressure control.

In a second aspect of the present invention, there is provided a substrate processing apparatus comprising: a processing chamber adapted to house substrates; a supply unit adapted to supply a processing gas into the processing chamber; a first pipe connected to the processing chamber at one end thereof; a turbo molecular pump disposed in the first pipe; a shutoff valve disposed between the processing chamber and the turbo molecular pump in the first pipe; a second pipe connected to the processing chamber at one end thereof and being smaller in sectional area than the first pipe; a pressure control valve disposed in the second pipe and having a predetermined bore; and a dry pump connected to the other end of the first pipe and to the other end of the second pipe.

According to the aforementioned second aspect of the present invention, the internal pressure of the processing chamber is controlled by the pressure control valve having the predetermined bore when carrying out treatments on the substrate housed in the processing chamber. Then, after performing treatments on the substrate, gases within the processing chamber are exhausted by a dry pump through a second pipe by opening the pressure control valve. The gases are further exhausted by a turbo molecular pump through a first pipe by closing the pressure control valve and opening a first shutoff valve. The pressure control valve having the predetermined bore controls the internal pressure of the processing chamber to a high level and the turbo molecular pump exhausts the gases within the processing chamber at a high rate. Consequently, it is possible to control the internal pressure of the processing chamber to a high level and exhaust the gases within the processing chamber at a high rate.

The processing gas can be a hydrogen fluoride gas.

With this arrangement, a hydrogen fluoride gas is supplied from a supply unit into the processing chamber. In general, a deposit film composed of an SiOBr layer, i.e., a pseudo-$SiO_2$ layer is formed on the side surfaces of trenches (grooves)

when etching a polysilicon layer of the substrate. The deposit film can be removed by a chemical reaction treatment and a heating treatment making use of a hydrogen fluoride gas, and a hard mask can be removed using the hydrogen fluoride gas. Consequently, in a case where a substrate wherein both a deposit film and a hard mask are formed is housed in the processing chamber, it is possible to remove the deposit film and the hard mask at the same time.

The shutoff valve can be a pressure control valve which is larger in bore than the pressure control valve.

With this arrangement, it is possible to control the internal pressure of the processing chamber to a low level since the pressure control valve having a large bore is capable of low-pressure control.

In a third aspect of the present invention, there is provided a substrate processing apparatus comprising: a processing chamber adapted to house substrates; a supply unit adapted to supply a processing gas into the processing chamber; a first pipe connected to the processing chamber at one end thereof; a turbo molecular pump disposed in the first pipe; a shutoff valve disposed between the processing chamber and the turbo molecular pump in the first pipe; a second pipe connected to between the processing chamber and the shutoff valve in the first pipe, at one end thereof, and being smaller in sectional area than the first pipe; a pressure control valve disposed midway through the second pipe and having a predetermined bore; and a dry pump connected to the other end of the first pipe and to the other end of the second pipe.

According to the aforementioned third aspect of the present invention, the internal pressure of the processing chamber is controlled by the pressure control valve having the predetermined bore when performing treatments on the substrate housed in the processing chamber. Then, after performing treatments on the substrate, gases within the processing chamber are exhausted by a dry pump through a second pipe by opening the pressure control valve. The gases are further exhausted by a turbo molecular pump through a first pipe by closing the pressure control valve and opening a first shutoff valve. The pressure control valve having the predetermined bore controls the internal pressure of the processing chamber to a high level and the turbo molecular pump exhausts the gases within the processing chamber at a high rate. Consequently, it is possible to control the internal pressure of the processing chamber to a high level and exhaust the gases within the processing chamber at a high rate.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail below with reference to the drawings showing preferred embodiments thereof.

First, a description will be made of a substrate processing system having a substrate processing apparatus according to an embodiment of the present invention.

Figure 1:
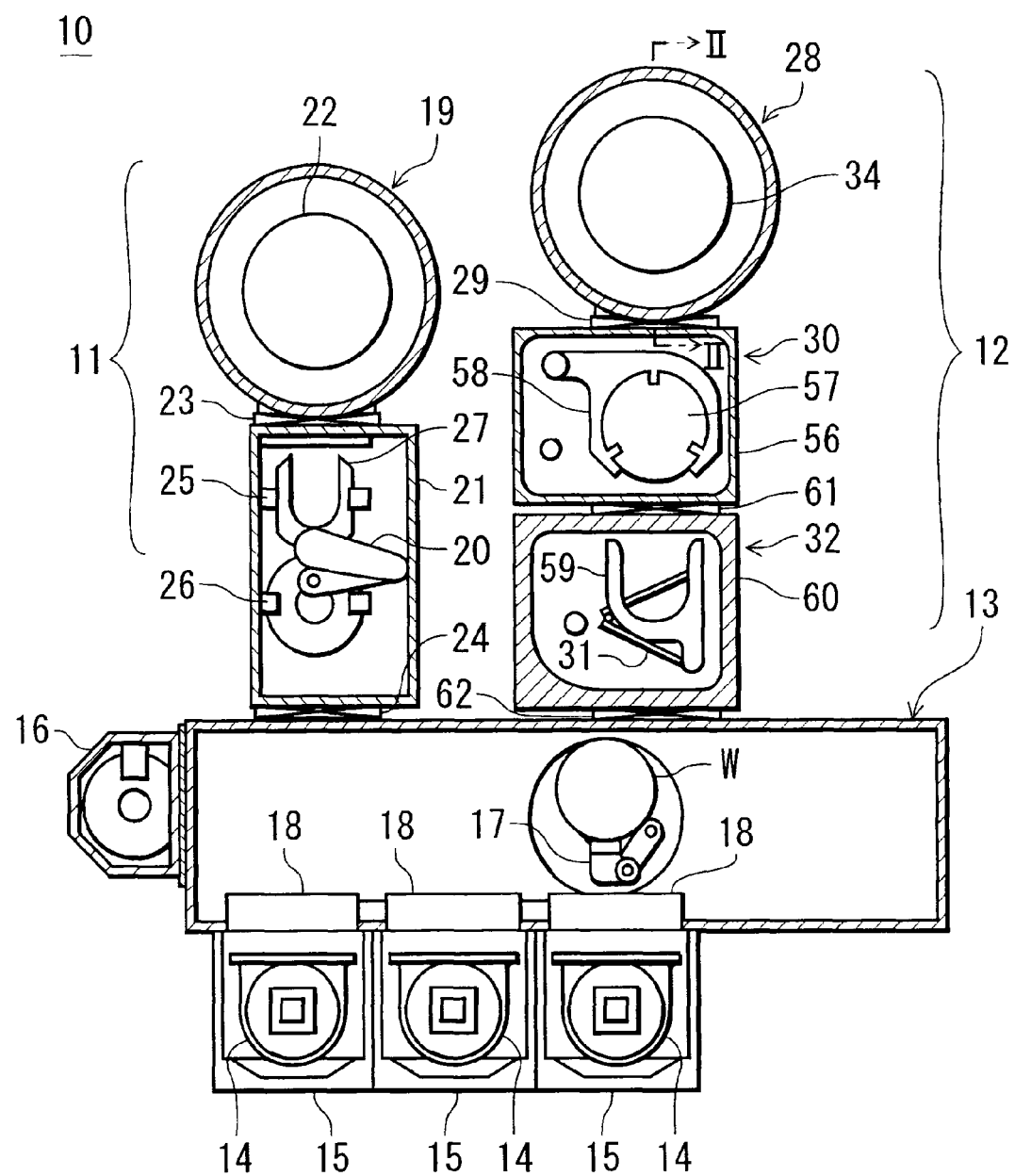
FIG. 1 is a plan view schematically showing the configuration of a substrate processing system having a substrate processing apparatus according to an embodiment of the present invention.

FIG. 1 is a plan view schematically showing the configuration of a substrate processing system having a substrate processing apparatus according to an embodiment of the present invention.

In FIG. 1, a substrate processing system 10 has a first process ship 11 for performing a plasma treatment on a wafer W (substrate) for semiconductor devices (hereinafter simply referred to as the "wafer W"), a second process ship 12 disposed parallel to the first process ship 11 to perform a later-described chemical reaction treatment and heating treatment on the wafer W, and a loader module 13 provided as a rectangular common transfer chamber to which the first and second process ships 11 and 12 are connected.

In addition to the first and second process ships 11 and 12, there are connected to the loader module 13, three FOUP mounting stages 15, each of which is mounted with a front opening unified pod (FOUP) 14 provided as a container for housing twenty-five wafers W and an orienter 16 for pre-aligning the position of each wafer W transferred out from the FOUP 14.

The first and second process ships 11 and 12 are connected to a side wall of the loader module 13 along the longitudinal direction thereof and disposed opposite to the three FOUP mounting stages 15 with the loader module 13 positioned therebetween. The orienter 16 is disposed at one end of the loader module 13 with respect to the longitudinal direction thereof.

The loader module 13 includes a scalar-type dual arm transfer arm mechanism 17 disposed therein and adapted to transfer the wafers W, and three loading ports 18 disposed on a side wall of the loader module 13 in correspondence with the respective FOUP mounting stages 15 and provided as inlets for the wafers W to be loaded through. The transfer arm mechanism 17 takes a wafer W out from a FOUP 14 mounted on a FOUP mounting stage 15 through the corresponding loading port 18, and transfers the removed wafer W into and out of the first process ship 11, the second process ship 12, and the orienter 16.

The first process ship 11 has a first process module 19 for performing a plasma treatment on a wafer W, and a first load lock module 21 containing a link-type single pick first transfer arm 20 for transferring the wafer W into and out of the first process module 19.

The first process module 19 has a cylindrical processing compartment (chamber) and upper and lower electrodes (not shown in the figure) disposed therein. The distance between the upper and lower electrodes is set so as to be appropriate for performing an etching treatment on wafers W as a plasma treatment. In addition, the lower electrode has in the top portion thereof an ESC 22 for chucking a wafer W by means of a coulomb force or the like.

In the first process module 19, a processing gas is introduced into the chamber and an electric field is generated between the upper and lower electrodes, whereby the introduced processing gas is turned into plasma to produce ions and radicals, thus performing etching on each wafer W using the ions and the radicals.

In the first process ship 11, the internal pressure of the first process module 19 is held at vacuum, whereas the internal pressure of the loader module 13 is held at atmospheric pressure. To this end, the first load lock module 21 has a vacuum gate valve 23 at a coupling part whereby the first load lock module 21 is coupled with the first process module 19, and an atmospheric gate valve 24 at a coupling part whereby the first load lock module 21 is coupled with the loader module 13. Thus, the first load lock module 21 is configured as a preliminary vacuum transfer chamber the internal pressure of which is adjustable.

Inside the first load lock module 21, the first transfer arm 20 is disposed in an approximately central portion of the module 21, a first buffer 25 is disposed closer to the first process module 19 than the first transfer arm 20, and a second buffer 26 is disposed closer to the loader module 13 than the first transfer arm 20. The first and second buffers 25 and 26 are disposed on a track along which moves a support portion (pick) 27 disposed at the leading end of the first transfer arm 20 to support a wafer W. An etch-treated wafer W is temporarily retracted above the track of the support portion 27, thereby enabling a smooth switch-over between the etch-treated wafer W and a wafer W to be etch-treated to take place in the first process module 19.

In the first process ship 11 of the substrate processing system 10, a polysilicon layer of a wafer W is etched using a hard mask formed in a predetermined pattern on the wafer W. At this time, a deposit film composed primarily of SiOBr is formed on the side surfaces of trenches (grooves) formed by etching. Note that SiOBr is similar in nature to $SiO_2$. From the viewpoint of throughput improvement, it is preferable that the deposit film and the hard mask be removed at the same time.

In the second process ship 12 of the substrate processing system 10, a chemical reaction treatment making use of hydrogen fluoride gas as a processing gas is performed on a wafer W and a heating treatment is further performed thereon, thereby removing the deposit film and the hard mask at the same time. Originally, the hard mask can be removed using hydrogen fluoride. In addition, the deposit film can be removed by applying the following chemical reaction treatment and heating treatment:
(Chemical Reaction Treatment)

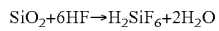

(Heating Treatment)

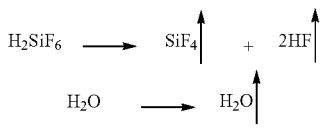

The second process ship 12 has a second process module 28 (substrate processing apparatus) for carrying out the above-described chemical reaction treatment on a wafer W, a third process module 30 connected to the second process module 28 through a vacuum gate valve 29 to perform the above-described heating treatment on the wafer W, and a second load lock module 32 containing a link-type single pick second transfer arm 31 for transferring a wafer W into and out of the second and third process modules 28 and 30.

Figure 2:
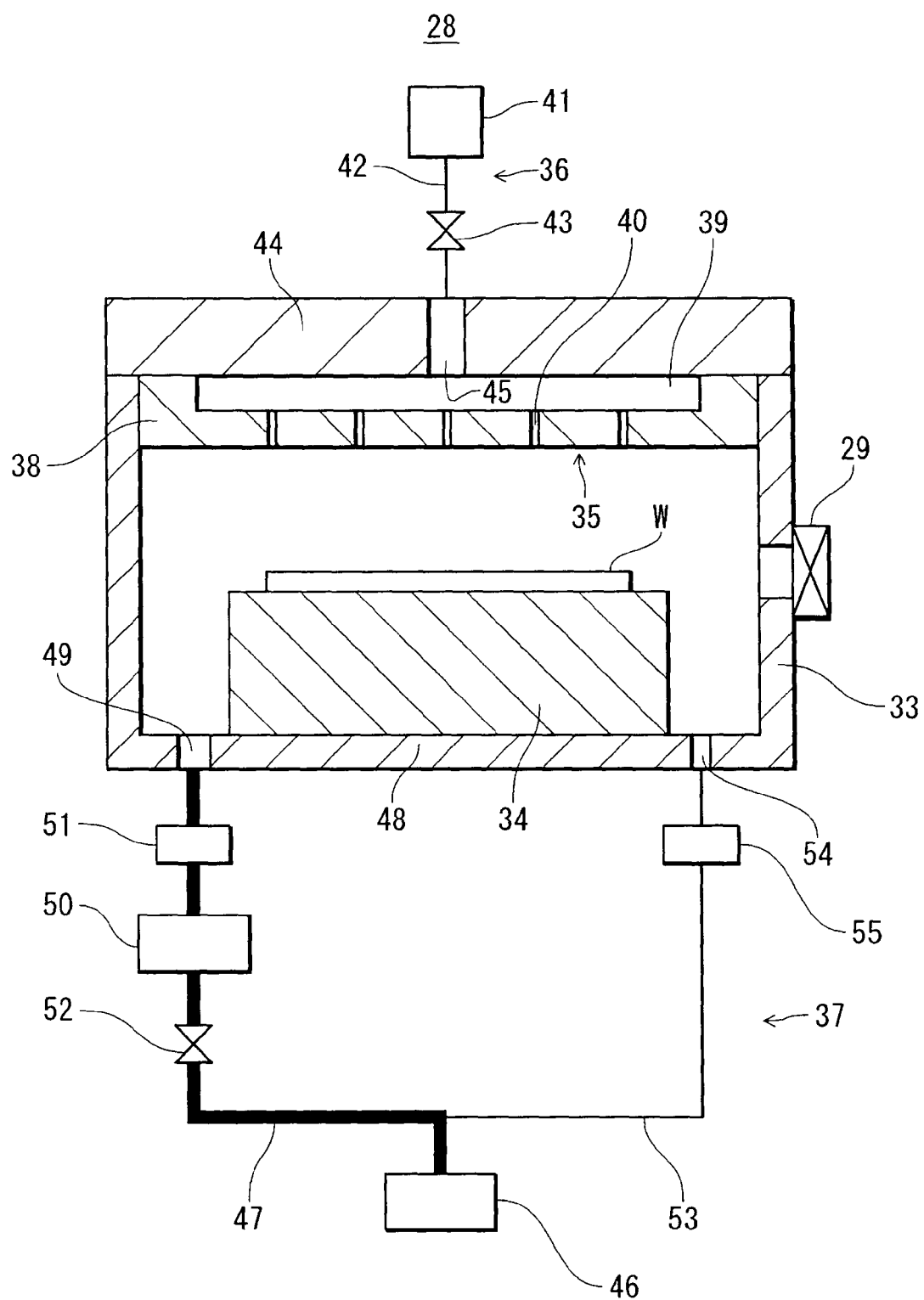
FIG. 2 is a sectional view taken along line II-II in FIG. 1.

FIG. 2 is a sectional view taken along line II-II in FIG. 1.

In FIG. 2, the second process module 28 has a cylindrical processing compartment (chamber) 33, a cooling stage 34 disposed in the chamber 33 and provided as a stage to be mounted with a wafer W, a gas distribution plate (GDP) 35 (supply unit) disposed above the chamber 33 so as to face the cooling stage 34, a gas introduction system 36 for introducing a hydrogen fluoride gas or the like to the GDP 35, and an exhaust control system 37 for exhausting gases and the like within the chamber 33 and controlling the internal pressure thereof.

The cooling stage 34 has a coolant chamber (not shown) as a temperature adjusting mechanism. A coolant, for example, cooling water or a Galden fluid, at a predetermined temperature is circulated through the coolant chamber. The processing temperature of a wafer W placed on the upper surface of the cooling stage 34 is controlled by the coolant temperature to a temperature appropriate for chemical reaction treatments. At this time, the cooling stage 34 is preferably maintained within a range from 10 to 40° C.

In addition, the cooling stage 34 has a plurality of pusher pins (not shown) as lifting pins adapted to project out from the upper surface of the cooling stage 34. These pusher pins are housed inside the cooling stage 34 when a wafer W is placed thereon, and are made to project out from the upper surface of the cooling stage 34 to lift the wafer W up when the wafer W subjected to a chemical reaction treatment is transferred out from the second process module 28.

The GDP 35 has a disc-shaped gas supply unit 38 and the gas supply unit 38 has a buffer chamber 39 and a plurality of gas supply holes 40. The buffer chamber 39 is communicated with the chamber 33 through the gas supply holes 40.

In addition, the GDP 35 contains a heater (not shown in the figure), for example, a heating element. This heating element controls the temperature of a hydrogen fluoride gas within the buffer chamber 39.

The gas introduction system 36 has a gas supply source 41 for supplying a hydrogen fluoride gas or the like, a gas introduction pipe 42 connected to the gas supply source 41, a valve 43 disposed midway through the gas introduction pipe 42. The gas introduction pipe 42 has a gas supply hole 45 open into the buffer chamber 39 of the gas supply unit 38 at the ceiling portion 44 of the chamber 33.

The exhaust control system 37 has an exhaust pipe 47 (first pipe) connected to a dry pump 46 provided as a vacuum pump for exhausting gases and the like within the chamber 33, and the exhaust pipe 47 has an exhaust hole 49 open into the chamber 33 at the bottom 48 thereof. A turbo molecular pump (TMP) 50 provided as an ultrahigh vacuum pump for exhausting gases and the like within the chamber 33 at a high rate is disposed midway through this exhaust pipe 47. In addition, an isolation valve 51 (first shutoff valve) is disposed between the chamber 33 and the TMP 50 in the exhaust pipe 47 and a downstream valve 52 (second shutoff valve) is disposed between the TMP 50 and the dry pump 46 in the exhaust pipe 47.

In addition, the exhaust control system 37 has an exhaust pipe 53 (second pipe) connected to the exhaust pipe 47 between the downstream valve 52 and the dry pump 46 and having a sectional area smaller than that of the exhaust pipe 47, and the exhaust pipe 53 has an exhaust hole 54 open into the chamber 33 at the bottom 48 thereof. An adaptive pressure control (APC) valve 55 having a relatively small bore is disposed midway through this exhaust pipe 53 as a pressure control valve for controlling the internal pressure of the chamber 33 to a high pressure, for example, 4000 Pa (30 Torr) or higher appropriate for the above-described chemical reaction treatment.

In this exhaust control system 37, gases and the like within the chamber 33 are exhausted through the exhaust pipe 53 by the dry pump 46 when the isolation valve 51 is closed and the APC valve 55 is opened. The gases and the like within the chamber 33 are exhausted at a high rate through the exhaust pipe 47 by the TMP 50 when the isolation valve 51 is opened and the APC valve 55 is closed. Note that the dry pump 46 also operates when the gases and the like within the chamber 33 are exhausted at a high rate by the TMP 50, in order to maintain the exhaust port pressure of the TMP 50 at a low level.

Referring back to FIG. 1, the third process module 30 has a box-shaped processing compartment (chamber) 56, a heating stage 57 disposed within the chamber 56 to serve as a table to be mounted with a wafer W, and a buffer arm 58 disposed in the vicinity of the heating stage 57 to lift a wafer W mounted on the heating stage 57.

The heating stage 57 is made of aluminum on the surface of which is formed an oxide film, and heats a wafer W mounted thereon up to a temperature appropriate for the above-described heating treatment using a heater (not shown) comprised of a built-in heating wire and the like. At this time, the heating stage 57 is preferably maintained at 175 to 200° C.

The buffer arm 58 temporarily retracts a wafer W having been subjected to the chemical reaction above the track of the support portion 59 of the second transfer arm 31, thereby enabling a smooth switch-over of wafers W to take place in the second and third process modules 28 and 30.

The second load lock module 32 has a box-shaped transfer compartment (chamber) 60 containing the second transfer arm 31. In addition, the internal pressure of each of the second and third process modules 28 and 30 is held at vacuum or a pressure below atmosphere pressure, whereas the internal pressure of the loader module 13 is held at atmospheric pressure. To this end, the second load lock module 32 has a vacuum gate valve 61 at a coupling part whereby the second load lock module 32 is coupled with the third process module 30, and an atmospheric door valve 62 at a coupling part whereby the second load lock module 32 is coupled with the loader module 13. Thus, the second load lock module 32 is configured as a preliminary vacuum transfer chamber the internal pressure of which is adjustable.

Next, a description will be made of substrate processing carried out by a substrate processing system having a substrate processing apparatus according to an embodiment of the present invention.

Figure 3:
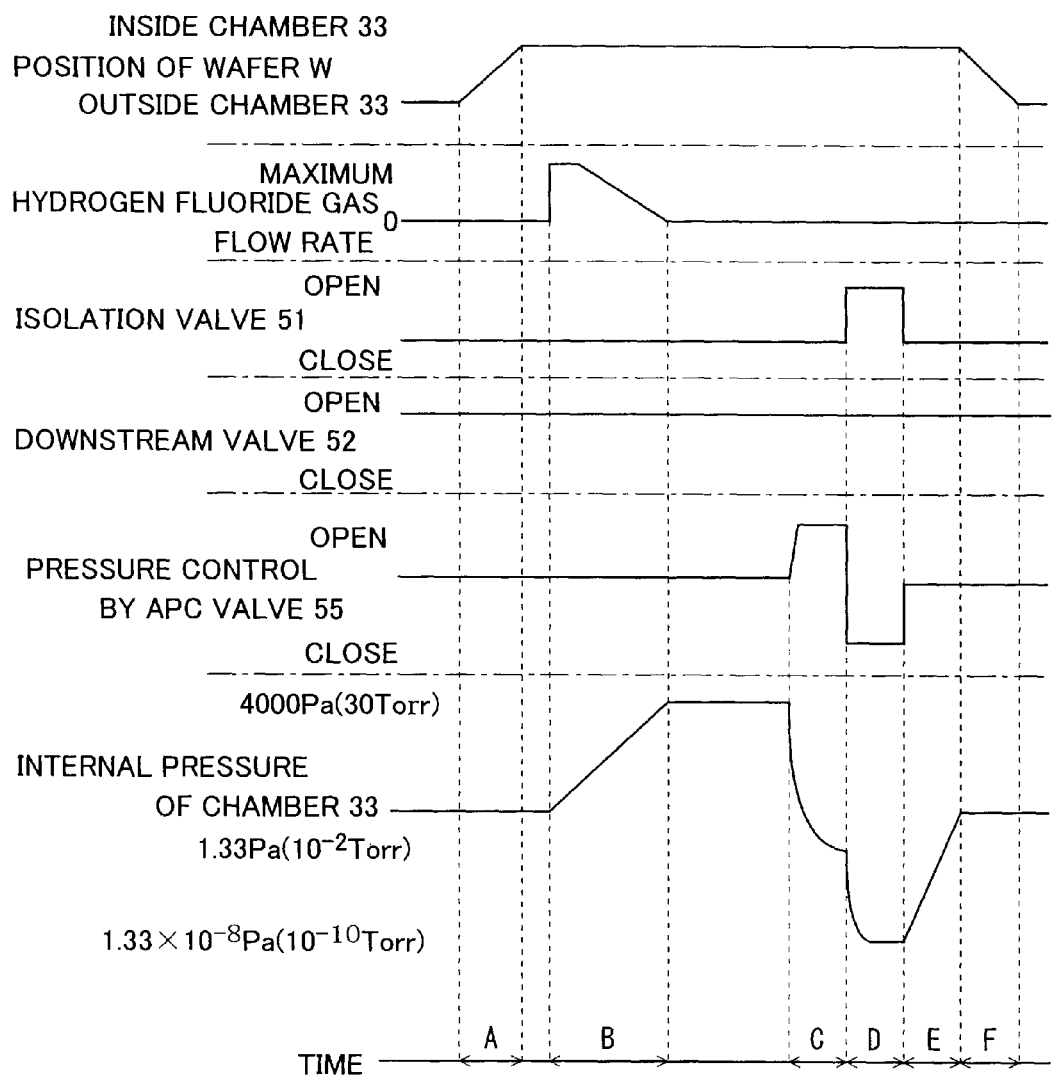
FIG. 3 is a sequence diagram of a chemical reaction treatment performed by a second process module in the substrate processing system shown in FIG. 1.

FIG. 3 is a sequence diagram of a chemical reaction treatment carried out by a second process module 28 in the substrate processing system 10 shown in FIG. 1.

In FIG. 3, an etching treatment is first performed in the first process ship 11, and a wafer W wherein a deposit layer is formed on the side surfaces of trenches is transferred into the chamber 33 of the second process module 28 and mounted on the cooling stage 34 (period A). Note that the internal pressure of the chamber 33 is previously controlled by the APC valve 55 so as to be maintained at a relatively high transfer pressure. The internal pressure of the chamber 33 is thus maintained at a relatively high pressure, in order to prevent any gases from flowing into the chamber 33 along with particles when the vacuum gate valve 29 of the second process module 28 is opened.

After that, a hydrogen fluoride gas is supplied from the gas supply unit 38 of the GDP 35 to a wafer W (period B). Here, a hard mask formed on the polysilicon film of the wafer W chemically reacts with the hydrogen fluoride gas and is thus removed. In addition, the deposit layer formed on the side surfaces of trenches chemically reacts with the hydrogen fluoride gas to form into a liquid product. At this time, the internal pressure of the chamber 33 is controlled by the APC valve 55 and raised to a pressure appropriate for chemical reaction treatments, specifically to a pressure as high as 30 Torr (first pressure control step). Since the hydrogen fluoride gas supplied to the wafer W is highly reactive, the gas rapidly reacts with the hard mask and the deposit layer. Accordingly, there is no need to constantly supply the hydrogen fluoride gas from the gas supply unit 38 all the time during a chemical reaction treatment. For example, the hydrogen fluoride gas may only be supplied during a partial period, as shown in the figure. In addition, there is no need to supply the hydrogen fluoride gas always at the maximum flow rate. For example, the hydrogen fluoride gas may be supplied at the maximum flow rate only during the initial period of supply, and then the flow rate may be gradually decreased thereafter, as shown in the figure. As a result, any large amount of hydrogen fluoride gas is not exhausted to the downstream side of the APC valve 55 when the internal pressure of the chamber 33 is controlled by the APC valve 55. Consequently, the internal pressure of the exhaust pipe 53 on the downstream side of the APC valve 55 and the internal pressure of the exhaust pipe 47 communicated with the exhaust pipe 53, i.e., the exhaust port pressure of the TMP 50, do not rise up to a predetermined high pressure at which the TMP 50 may suffer damage. Accordingly, there is no need to prevent the exhaust port pressure from rising up to the predetermined high pressure by closing the downstream valve 52, and therefore, there is no need to stop the TMP 50. Note that it takes time to restart the TMP 50 when the TMP 50 is stopped, thus significantly degrading the throughput of the second process module 28. Since there is no need to stop the TMP 50 in the present embodiment, it is possible to prevent a degradation in the throughput.

Next, after the completion of a chemical reaction treatment, the APC valve 55 is gradually opened and a hydrogen fluoride gas and the like within the chamber 33 are exhausted through the exhaust pipe 53 by the dry pump 46 (period C) (first exhaust step). Also at this time, the APC valve 55 is gradually opened to prevent a large amount of hydrogen fluoride gas from being exhausted to the downstream side of the APC valve 55. Thus, the exhaust port pressure of the TMP 50 is prevented from rising to the aforementioned predetermined high pressure, as described above.

With the dry pump 46 alone, it is not possible to decrease the internal pressure of the chamber 33 below a certain value, for example, 1.33 Pa ($10^{-2}$ Torr). Hence, when the internal pressure of the chamber 33 reaches 1.33 Pa ($10^{-2}$ Torr), the isolation valve 51 is opened and the APC valve is closed to exhaust the hydrogen fluoride gas and the like within the chamber 33 by the TMP 50 through the exhaust pipe 47 at a high rate (period D) (second exhaust step). At this time, the internal pressure of the chamber 33 decreases to approximately $1.33 \times 10^{-8}$ Pa ($10^{-10}$ Torr) and the hydrogen fluoride gas and the like within the chamber 33 are fully exhausted.

Then, the isolation valve 51 is closed and the internal pressure of the chamber 33 is controlled by the APC valve 55 (period E) (second pressure control step). Note that at this time, an inert gas, specifically a nitrogen gas, is introduced from the gas introduction system 36 to the GDP 35 and the nitrogen gas is supplied from the gas supply unit 38 of the GDP 35 into the chamber 33. Here, the internal pressure of the chamber 33 is raised to the aforementioned transfer pressure.

Then, a wafer W having been subjected to a chemical reaction treatment is transferred out from the chamber 33 of the second process module 28 (period F).

According to the present embodiment, the internal pressure of the chamber 33 is controlled by the APC valve 55 having a relatively small bore when performing a chemical reaction treatment on a wafer W housed in the chamber 33. Then, after performing the chemical reaction treatment on the wafer W, the APC valve 55 is opened to exhaust a hydrogen fluoride gas and the like within the chamber 33 through the exhaust pipe 53 by the dry pump 46. The hydrogen fluoride gas and the like are further exhausted by the TMP 50 through the exhaust pipe 47 by closing the APC valve 55 and opening the isolation valve 51. The APC valve 55 having a relatively small bore controls the internal pressure of the chamber 33 to a pressure as high as 4000 Pa (30 Torr) and the TMP 50 exhausts the hydrogen fluoride gas and the like within the chamber 33 at a high rate. Consequently, it is possible to control the internal pressure of the chamber 33 to a high pressure appropriate for a chemical reaction treatment and exhaust a hydrogen fluoride gas and like within the chamber 33 at a high rate.

Although the APC valve 55 is used in the present embodiment as a valve for pressure control, a pressure control valve (PCV) or the like may be alternatively used. In addition, the pressure control valve may be of any type, including a pendulum valve and a butterfly valve.

In addition, although the TMP 51 is used in the present embodiment as an ultrahigh vacuum pump, a water pump or a cryopump may be alternatively used or these pumps may be used in combination.

In addition, although the isolation valve 51 is disposed on the upstream side of the TMP 50 in the exhaust pipe 47, an APC valve having a relatively large bore may be disposed in place of the isolation valve 51. In this case, the internal pressure of the chamber 33 can be controlled by the APC valve of the exhaust pipe 47. In particular, since low-pressure control is possible with the APC valve having a relatively large bore, it is possible to control the internal pressure of the chamber 33 to a low level.

The above-described present embodiment is configured so that the exhaust pipe 53 has the exhaust hole 54 open into the chamber 33 and gases and the like within the chamber 33 are exhausted through the exhaust hole 54 by the dry pump 46. Alternatively, the exhaust pipe 53 may be connected between the chamber 33 and the isolation valve 51 in the exhaust pipe 47 and the gases and the like within the chamber 33 may be exhausted through the exhaust hole 49.

As described above, the present invention is applied to a substrate processing apparatus wherein treatments are performed on a substrate using a hydrogen fluoride gas. However, the present invention is also applicable to substrate processing apparatus wherein treatments are performed on a substrate using any highly persistent gases, for example, a helium gas, an ammonia gas or a hydrogen gas, without limitation to a hydrogen fluoride gas. When applying the present invention to substrate processing apparatus wherein treatments are performed on a substrate using any highly persistent gases, the internal pressure of a processing chamber may be controlled to a pressure as high as 133 Pa (1 Torr) or greater or as high as 2660 Pa (20 Torr) or greater, during substrate processing.

In the above-described present embodiment, a chemical reaction treatment and a heating treatment are separately performed in different process modules. Alternatively, these treatments may be performed in one process module.

Although a description has been made to a substrate processing system wherein two process ships are disposed in parallel, as a substrate processing system having the substrate processing apparatus according to the above-described present embodiment, the substrate processing system is not limited to this configuration. Specifically, the substrate processing system may have a configuration wherein a plurality of process modules are disposed in tandem or in cluster form.

In addition, a substrate on which a chemical reaction treatment and a heating treatment are performed is not limited to a wafer for semiconductor devices, but may be other various types of substrates used for LCDs, flat panel displays (FPDs) or the like, a photomask, a CD substrate, a printed board, or the like.

It is to be understood that the object of the present invention may also be accomplished by supplying a system or an apparatus with a storage medium in which a program code of software which realizes the functions of the above described embodiment is stored, and causing a computer (or CPU or MPU) of the system or apparatus to read out and execute the program code stored in the storage medium.

In this case, the program code itself read from the storage medium realizes the functions of any of the embodiments described above, and hence the program code and the storage medium in which the program code is stored constitute the present invention.

Examples of the storage medium for supplying the program code include a floppy (registered trademark) disk, a hard disk, a magnetic-optical disk, a CD-ROM, a CD-R, a CD-RW, DVD-ROM, a DVD-RAM, a DVD-RW, a DVD+RW, a magnetic tape, a nonvolatile memory card, and a ROM. Alternatively, the program may be downloaded via a network.

Further, it is to be understood that the functions of the above described embodiment may be accomplished not only by executing a program code read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided on an expansion board inserted into a computer or in an expansion unit connected to the computer and then causing a CPU or the like provided in the expansion board or the expansion unit to perform a part or all of the actual operations based on instructions of the program code.

The above-mentioned program code may comprise a program code performed by the object code or the interpreter, a script data supplied to the OS, or the like.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2007-022332 filed Jan. 31, 2007, which is hereby incorporated by reference herein in its entirety.

What is claimed is:

1. A substrate processing method for use in a substrate processing apparatus having a processing chamber adapted to house substrates, a supply unit adapted to supply a processing gas into the processing chamber, a first pipe connected to the processing chamber at one end thereof, a turbo molecular pump disposed in the first pipe, a first shutoff valve disposed between the processing chamber and the turbo molecular pump in the first pipe, a second pipe connected to the processing chamber at one end thereof and being smaller in sectional area than the first pipe, a pressure control valve disposed in the second pipe and having a predetermined bore, and a dry pump connected to the other end of the first pipe and to the other end of the second pipe, said substrate processing method comprising:

a substrate processing step of performing a treatment on a substrate housed in said processing chamber by supplying the processing gas into the processing chamber;

a first exhaust step of exhausting gases within the processing chamber through the second pipe using the dry pump by opening the pressure control valve after performing the treatment on the substrate; and a second exhaust step of exhausting gases within the processing chamber through the first pipe using the turbo molecular pump by closing the pressure control valve and opening the first shutoff valve after said first exhaust step, wherein the first pipe and the second pipe merge with each other downstream of the turbo molecular pump in the first pipe and downstream of the pressure control valve in the second pipe, the first pipe is provided with a second shutoff valve disposed between an exhaust port of the turbo molecular pump and a merging portion in which the first pipe merges with the second pipe, in said substrate processing step, the first shutoff valve is closed, the second shutoff valve is opened, said pressure control valve controls an internal pressure of said processing chamber so that an interior of said processing chamber and the exhaust port of the turbo molecular pump communicate with each other, the turbo molecular pump is driven all the time during said substrate processing step, and the supply unit supplies the processing gas into the processing chamber only during a partial period in said substrate processing step such that the processing gas is supplied at a maximum flow rate only during an initial period of supply, and then a flow rate of the processing gas is gradually decreased thereafter.

2. A substrate processing method as claimed in claim 1, further including a pressure control step of controlling the internal pressure of the processing chamber using the pressure control valve after closing the first shutoff valve after the second exhaust step.

3. A substrate processing method as claimed in claim 1, wherein the processing gas is a hydrogen fluoride gas.

4. A substrate processing method as claimed in claim 1, wherein the internal pressure of the processing chamber is controlled to a pressure as high as 133 Pa (1 Torr) or greater in said substrate processing step.

5. A substrate processing method as claimed in claim 1, wherein the internal pressure of the processing chamber is controlled to a pressure as high as 2660 Pa (20 Torr) or greater in said substrate processing step.

6. A substrate processing method as claimed in claim 1, wherein the internal pressure of the processing chamber is controlled to a pressure as high as 4000 Pa (30 Torr) or greater in said substrate processing step.

7. A substrate processing method as claimed in claim 1, wherein the first shutoff valve is a pressure control valve which is larger in bore than the pressure control valve.

* * * * *